United States Patent [19]
Cusick et al.

[11] 3,827,619
[45] Aug. 6, 1974

[54] ULTRASONIC BOND MONITOR

[75] Inventors: John H. Cusick, Santa Rosa; Alvin E. Brown, Redwood; Al S. Hamamoto, San Jose; Jack L. S. Bellin, Palo Alto, all of Calif.

[73] Assignee: The United States of America as represented by the Secretary of the Navy, Washington, D.C.

[22] Filed: Jan. 19, 1973

[21] Appl. No.: 325,272

[52] U.S. Cl. .......... 228/1, 73/71.4, 29/407, 29/470.1
[51] Int. Cl. .......... B23k 5/20
[58] Field of Search .......... 228/1, 8, 9; 29/470.1, 29/407; 73/71.4, 67.2; 324/56

[56] References Cited

UNITED STATES PATENTS

| | | | |
|---|---|---|---|
| 3,056,192 | 10/1962 | Jones | 228/1 X |
| 3,153,850 | 10/1964 | Worlton et al. | 29/470 |
| 3,212,695 | 10/1965 | MacGregor | 228/1 |
| 3,302,277 | 2/1967 | Pruden et al. | 29/407 |
| 3,734,382 | 5/1973 | Spanjer | 228/8 X |

OTHER PUBLICATIONS

Goldman, Richard, Ultrasonic Technology, 1962, pp. 48–51.

*Primary Examiner*—J. Spencer Overholser
*Assistant Examiner*—Robert J. Craig
*Attorney, Agent, or Firm*—Richard S. Sciascia; J. M. St. Amand; David O'Reilly

[57] ABSTRACT

A system and method for monitoring the bond strength of ultrasonic bonds. A measure of bond quality is obtained non-destructively, by developing a voltage which is proportional to the amplitude of the traverse motion of the ultrasonic bonding tool, and also developing, by means of a transducer, a second voltage proportional to the tangential component of the forces applied during bonding. The voltages are fed into a logic circuit to derive their ratio, which is a measure of the bonding quality.

8 Claims, 2 Drawing Figures

ULTRASONIC BOND MONITOR

BACKGROUND OF THE INVENTION

The present invention relates generally to ultrasonic bonding and more particularly relates to methods of monitoring the quality of ultrasonic bonding of lead wires to solid state components.

In the field of ultrasonic bonding of lead wires to solid state components, greater use of miniaturized circuits has increased the need for improved bonding techniques. This is especially true since investigations have revealed that a high percentage of component failure results at the bond between the component and lead wire. At present, the quality of ultrasonic bonds depends largely on the skill of the operator because bonder settings are arbitrarily set based on the experience of the operator. Further, the only known effective method of testing the quality of a bond is by destructive testing of random samples which are not necessarily conclusive of other bonds. Since quality controls have greatly improved solid state devices, it is imperative that the quality of bonds is improved commensurately. Research conducted in this area resulted in the present invention which presents one possible solution to the problems stated above.

SUMMARY OF THE INVENTION

The purpose of the present invention is to provide improved bonds when securing lead wires ultrasonically to solid state components.

The present invention monitors the quality of a bond during the bonding process. The development of this invention is based on the proposition that bond quality is proportional to the forces applied during the bonding process. This is accomplished by converting the forces applied during bonding into corresponding electrical signals. The electrical signals are then fed into a logic circuit to derive their ratios. Since bond strength is directly proportional to the dynamic modulus of the materials being bonded, the ratio derived is a direct measure of the bond quality. The ratio derived is displayed on an oscilloscope or other suitable indicating device, and gives continuous evaluation of wire bond strength during the bond formation process. This information is available for the enlightenment of the bonding machine operator or for automatic control of the bonding process itself.

OBJECTS OF THE INVENTION

It is one object of the present invention to provide a method and apparatus for monitoring the quality of ultrasonic bonds.

Another object of the present invention is to monitor the quality of ultrasonic bonds during the bond formation process.

Still another object of the present invention is to provide information to an ultrasonic bond machine operator during the bonding process which indicates the quality of a bond.

Yet another object of the present invention is to convert forces applied during the bonding process to corresponding electrical signals which give a direct measure of bond quality.

Other objects, advantages, and novel features of the invention will become apparent from the following detailed description of the invention when considered in conjunction with the accompanying drawings.

DESCRIPTION OF THE PREFERRED EMBODIMENT

Figure 1:
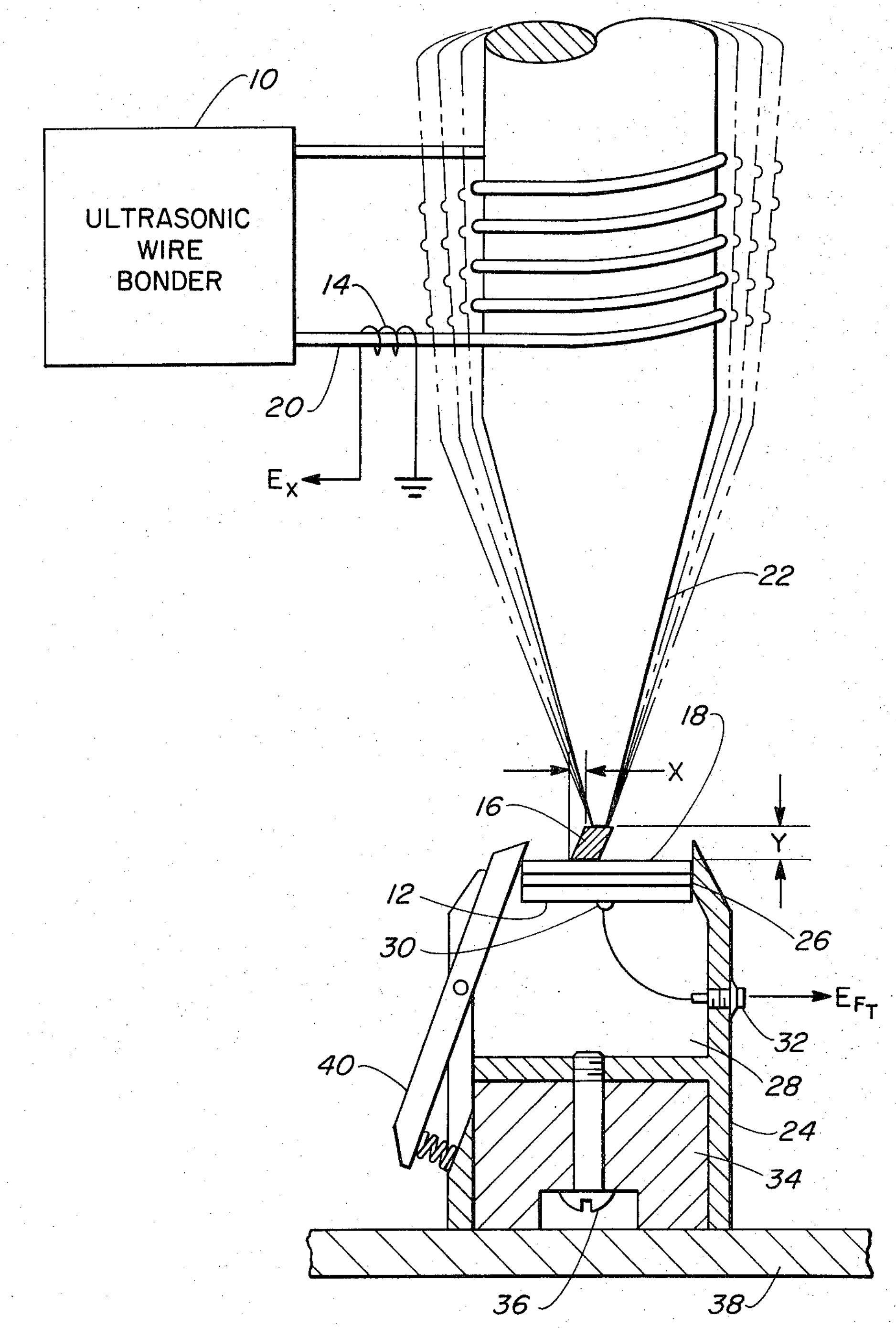
FIG. 1 illustrates the operation of the bond monitor in conjunction with an ultrasonic wire bonder.

In order to measure bond quality without destroying the bond, electrical signals are derived which are directly proportional to bond quality. By means of a piezoelectric matrix transducer, the bond monitor converts the force applied during bonding of lead wires, or attaching of dies to headers or bases, into corresponding electric signals. The force applied during bonding consists primarily of a tangential component ($F_T$) and is related as follows:

$$F_T = M\ A\ S \qquad (1)$$

Where M = dynamic modulus of the wire being bonded

A = effective bond area

S = shear strain

Also: $S = x/Y$

Where $x$ = shear amplitude

Y = effective bond thickness

When $x/Y$ is substituted for S in equation (1), we have: $F_T = M\ A\ x/Y \qquad (2)$ or:

$$F_T/x = M\ A/Y \qquad (3)$$

Since the bond strength is directly proportional to the dynamic modulus (M) of the materials being bonded and the effective bond area (A), and inversely proportional to effective bond thickness (Y), as shown by equation (3), the ratio $F_T/x$ is a direct measure of bond quality.

In order to provide a useful display of this measure, electrical signals, directly proportional to $F_T$ and x, respectively, are produced. The electrical signals are then processed and combined to produce an output equal to the ratio $F_T/x$. A calibrated display of this ratio will then provide information as to the bond quality during the bonding process.

FIG. 1 shows the bond monitor set up to operate in conjunction with an ultrasonic bonder to measure the forces between wire 16 and chip 18 undergoing bonding. The bonder 10 used was an EMB (Engineering Machine Builders) 1,100 ultrasonic stitch bonder (Uthe Engineering, Inc., model 10 power supply). By means of a piezoelectric matrix transducer 12 and a pick-up coil 14, the bond monitor converts the forces applied during bonding of lead wires 16, or in attaching dies to headers or bases, into corresponding electrical signals (E). A pick-up coil 14 coupled to the drive wire 20 of the ultrasonic bonder 10 develops an electrical signal ($E_x$), which is proportional to the amplitude (X) of the traverse motion of the bonding tool 22. That is, the electrical signal is proportional to the shear amplitude (X) of equations (2) and (3) above. An electrical signal proportional to the tangential component ($F_T$) is produced by a piezoelectric transducer 12 in contact with the chip 18 undergoing the bonding process.

The piezoelectric transducer 12 employed is a zirconate-lead titanate (PZT) ceramic which is poled perpendicular to the direction of the bonding tool electrode 22 for measuring tangential forces during bonding. This transducer 12 disc was mounted in a housing 24 which held it in place and would also hold the chip 18 undergoing the bonding process. The transducer disc 12 is located in the housing 24 beneath a protective aluminum wafer shield 26. The aluminum wafer 26 also acts as a grounding electrode to the aluminum housing 24. Behind the aluminum shield 26 and PZT disc 12 is an epoxy filled cavity 28 holding the force sensing transducer 12 in place as well as isolating the high electrode side 30 from ground. The high electrode 30 is connected to a terminal 32 which is insulated from the aluminum housing 24. The housing 24 also contains a strong magnet 34 held in place by a screw 36 to aid the operator in securing the position of the bond monitor to the base 38 of the stitch bonder employed. In addition, a spring loaded clip 40 is provided to hold the chip 18 undergoing bonding directly over the transducer 12.

During the bonding process, the normal forces on the wire to chip being bonded were held constant. The electrical signal ($E_{F_T}$) proportional to the tangential component $F_T$ is fed from the terminal 32 in the side of the aluminum housing 24 to the processing circuit shown in FIG. 3. The electrical signal ($E_x$) proportional to the shear amplitude (X) is also fed to the processing circuit of FIG. 3.

The electrical signal from the transducer 12 ($E_{F_T}$) and the pick-up coil 14 ($E_x$) depicted in FIG. 1 are combined as shown in the block diagram circuit of FIG. 3. Channels A and B are identical circuits designed for determining the bond quality parameters $F_T$ and x. The measurement of the ratio $F_T/x$ is performed electrically by taking the logarithmic difference of $E_{F_T}$ and $E_x$. Although the resulting voltage can be measured by any conventional method, the instrument employed during the course of the ultrasonic bonding was a digital voltmeter. Bond quality is correlated to the logarithmic voltage differences and the ultimate goal is to provide the ultrasonic bond operator with an audio or visual indication of poor bond suspects.

Signal channels A and B are identical and begin by processing the signals through a preamplifier 42, 42′ having a gain of approximately 10. The amplified output is then detected by a half wave rectifier circuit 44, 44′ that minimizes the non-linearity effect of rectifying diodes to provide linear rectification. The detected signal is subsequently fed into a high impedance circuit 46, 46′ to further ensure linear rectification and, in addition, to provide a means of adjusting trigger level of the integration circuit 48, 48′ by means of a DC balance circuit. A DC balance adjustment in high impedance circuit 46, 46′ is set to ensure simultaneous integration of the two incoming signals ($E_{F_T}$ and $E_x$) encountered during bonding. The integration circuit 48, 48′ is reset to zero each time a new bond is made, by a command circuit 50, which is in turn controlled by the electrical signal ($E_x$) from preamplifier 42, to assure the integration of signals free from residual voltages stored in the feedback capacitor of the integrator circuit 48, 48′.

The integrated signal is then fed into an operational amplifier 52, 52′ employing a dual NPN silicon transistor as a logarithmic feedback element. The signals are logarithmically coupled through the NPN feedback transistor and amplified before being fed into a difference amplifier 54. Both signals ($E_{F_T}$) and $E_x$)are then combined and a voltage proportional to their difference stored and held in a sample and hold circuit 56. The output of the difference amplifier is $\log E_{F_T} - \log E_x$. The voltmeter readout 58 gives an indication of the quantity $\log E_{F_T} - \log E_x$ throughout the "hold" until another bond signal is received. At that time the command circuit 50 resets the integrator 48, 48′ and sample and hold circuit 56 to enable derivation of the logarithmic ratio $F_T/x$ of the incoming bond signals.

Figure 2:
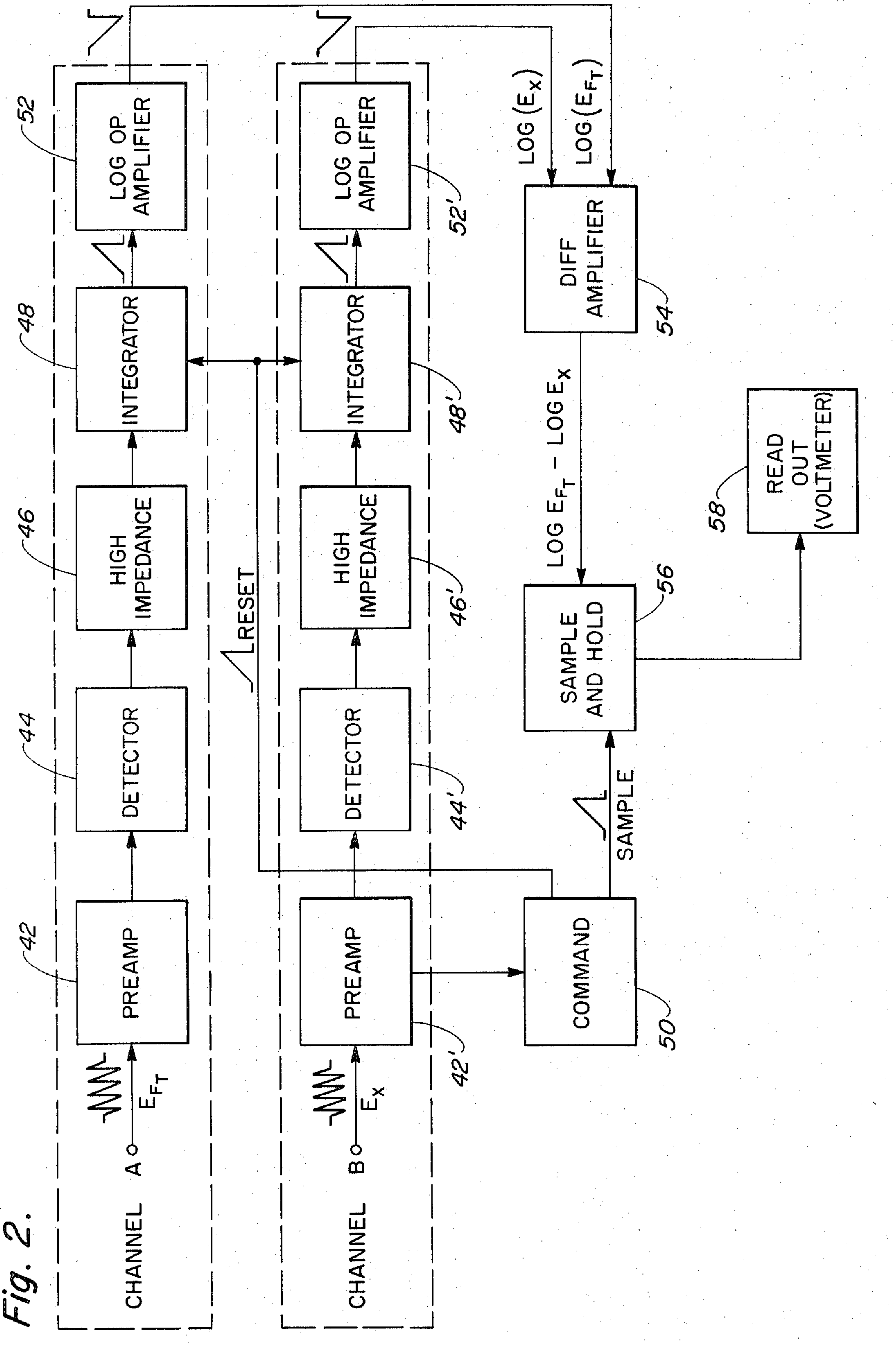
FIG. 2 is a block diagram of the logic circuit used to process the electrical signals produced during the bonding process.

In FIG. 2 the block labeled "readout" indicates a voltmeter display. However, a number of types of displays may be used such as an oscilloscope or an audio alarm.

Thus, there has been disclosed a novel method and apparatus for non-destructive measuring of the quality of bonds during ultrasonic bonding of wire to solid state chips. Obviously, many modifications and variations of the present invention are possible in the light of the above teachings. It is therefore to be understood that within the scope of the appended claims, the invention may be practiced otherwise than as specifically described.

We claim:

1. Apparatus for indicating the quality of a bond made by an ultrasonic bonder during the bonding process comprising:

means for developing a first electrical signal proportional to a tangential force applied to the materials being bonded during the bonding process;

means for developing a second electrical signal proportional to the amplitude of a traverse motion of the bonding tool;

means for combining the first and second electrical signals to produce an output signal equal to the ratio of the first electrical signal to the second electrical signal; and means for displaying the output from the signal combining means so that poor bonds may be readily detected.

2. The apparatus of claim 1 wherein the means for developing the first electrical signal is a pick-up coil coupled to the drive wire of the ultrasonic bonder.

3. The apparatus of claim 2 wherein the second electrical signal generating means is a piezoelectric transducer in contact with the material undergoing the bonding process.

4. The apparatus of claim 3 wherein the transducer is a zirconate-lead titanate ceramic disc.

5. The apparatus of claim 4 wherein the means for combining the first and second electric signals comprises:

means for converting the first and second signals to first and second logarithmic voltages;

a difference amplifier connected to the converting means having an output equal to the difference between the first and second logarithmic signals;

a sample and hold circuit connected to the difference amplifier; and means for displaying the output of the sample and hold circuit.

6. The apparatus of claim 5 wherein the converting means are first and second identical channels comprising:

a preamplifier receiving the output of the transducer and pick-up coil respectively;

a detector connected to the preamplifier;

a high impedance circuit connected to the detector to ensure linear rectification and having a balance circuit for adjusting the trigger level of an integrator;

an integrator connected to the high impedance circuit; and a logarithmic operational amplifier connected to the integrator.

7. The apparatus of claim 6 wherein the display means is a digital voltmeter.

8. The apparatus of claim 7 including a command circuit for resetting the integrator and triggering the sample and hold circuit each time a new bond is made; said command circuit being controlled by a signal from the preamplifier of the channel receiving the electrical signal from the pick-up coil.

* * * * *